(12) United States Patent
Gregory

(10) Patent No.: US 7,955,485 B2
(45) Date of Patent: Jun. 7, 2011

(54) PLANAR LAMINATE SUBSTRATE AND METHOD FOR FABRICATING ORGANIC LAMINATE SUBSTRATE PCBS, SEMICONDUCTORS, SEMICONDUCTOR WAFERS AND SEMICONDUCTOR DEVICES HAVING MINIATURIZED ELECTRICAL PATHWAYS

(76) Inventor: William Kent Gregory, Tualatin, OR (US)

( * ) Notice: Subject to any disclaimer, the term of this patent is extended or adjusted under 35 U.S.C. 154(b) by 116 days.

(21) Appl. No.: 12/218,867

(22) Filed: Jul. 17, 2008

(65) Prior Publication Data

US 2010/0015440 A1    Jan. 21, 2010

(51) Int. Cl.
*C25D 5/02* (2006.01)
(52) U.S. Cl. ............................................. 205/125
(58) Field of Classification Search .................. 205/118, 205/125
See application file for complete search history.

(56) References Cited

U.S. PATENT DOCUMENTS

| | | | | | |
|---|---|---|---|---|---|
| 4,543,295 | A | * | 9/1985 | St. Clair et al. | 428/458 |
| 5,783,641 | A | * | 7/1998 | Koh et al. | 525/333.8 |
| 6,162,512 | A | * | 12/2000 | Koh et al. | 427/529 |
| 6,824,827 | B2 | * | 11/2004 | Katsuki et al. | 427/307 |

* cited by examiner

*Primary Examiner* — Luan V Van
(74) *Attorney, Agent, or Firm* — Mark S. Hubert

(57) ABSTRACT

The present invention is a method of manufacturing miniaturized organic laminate substrate PCB, semiconductors, semiconductor wafers and semiconductor devices that have a 50% reduction in physical dimensions with respect to prior art existing organic laminate substrate PCB, semiconductors, semiconductor wafers and semiconductor devices. The base planar substrate has a vapor deposited 0.02 mil thick copper cladding thereon its first planar surface that has been affixed atop a hydrophillic layer, and an adhesive layer on its second planar surface. The copper cladding has sufficient peel strength and a low enough etch factor so as to allow 10 micron (or smaller) electrical trace pathways to be formed thereon when the steps of a specifically designed manufacturing methodology are followed.

8 Claims, 7 Drawing Sheets

Etch

Strip Resist

PLANAR LAMINATE SUBSTRATE AND METHOD FOR FABRICATING ORGANIC LAMINATE SUBSTRATE PCBS, SEMICONDUCTORS, SEMICONDUCTOR WAFERS AND SEMICONDUCTOR DEVICES HAVING MINIATURIZED ELECTRICAL PATHWAYS

BACKGROUND OF THE INVENTION

The present invention relates to a planar laminate substrate base and method of fabricating printed circuit boards (PCBs) and related semiconductor devices starting from this substrate, that offers at least a 2:1 reduction in the physical dimensions of current technology PCBs and related semiconductor devices.

With the advent of higher processing speeds and as the reduction in electronic component geometries accelerates, manufactures of laminate substrates are being pushed to provide base materials and components that are capable of delivering performance values that exceed current material capabilities and production techniques. Because of rapidly emerging technologies, the boundaries between semiconductor packaging, and PCB technologies are blurred; these must all be considered concurrently in an overarching approach in order to optimize the substrate design. In the semiconductor industry, assembly and packaging is a critical competitive factor of the semiconductor product as it affects operating frequency, power, reliability, and cost.

The future base material and components will need to possess better electrical characteristics such as lower Er (Dk); lower Loss Tangents (Df); highly electrically conductive metallurgy to minimize resistive voltage drops and to effectively deliver power to the chip; low-inductance connections to reduce simultaneous switching noise; low-dielectric constant insulator materials to better match board impedances and to reduce undesirable parasitic capacitances; and advanced thermal interface materials to manage high power densities on the chip and to improve the ability to work in higher temperature environments.

Most importantly is that these base materials will need to lend themselves to production techniques that allow for feature sizes in the line width (traces) and line spacing (trace spacing) down to 10μ (0.00039 inch) or less and a dielectric (substrate) thickness of 25μ (0.00098 inch) or less. The key to resolving these problems and accomplishing a further miniaturization of electronic components lies in achieving an extremely thin, yet resilient copper layer on a dielectric substrate base, that has a high peel strength. Such a planar laminate substrate would possess a low etch factor in the etching phases of fabrication and result in much finer traces and trace spacings.

A conventional printed circuit board (PCB) consists of a fully resin cured fiberglass-reinforced epoxy dielectric substrate base clad on at least one side with a layer of copper. Currently, there are three mainstream industry standard methods of adhering the copper to the base: electroless/electrophoretic deposition; foil buildup (laminated foil on uncured laminate); and RCC (resin coated copper). Each of these methods utilize a dendretic structure for the adhesion of the copper to the substrate base.

In the first method, the substrate is prepared by roughing up the bonding surface and or applying a bonding agent that is cured onto the substrate prior to the deposition of the copper. The deposition of copper must be thick enough to achieve a dendritic adhesion to the substrate surface so as to maintain a high peel strength of the copper layer. Generally this requires a copper layer that is 0.00007 inch (7 mils) thick. It is this thickness that governs the limits of line width (traces) and spacing. This product can't accommodate traces and spacing less than 20μ (0.0008 inch) wide each because it is limited by the physical characteristics of the dendritic structures required to achieve the adequate peel strength characteristic.

The second method affixes copper foil to a uncured dielectric substrate by heat and pressure in a lamination press. Again, product made by this method can't accommodate traces and spacing less than 20μ (0.0008 inch) wide each because it is limited by the physical characteristics of the dendritic structures required to achieve the adequate peel strength characteristic as well as the etch factor effect on the copper in the related etching process steps.

The third method affixes thin copper foil to the surface of the substrate through the use of an adhesive (usually this is the same resin that the substrate laminar base is made of with the exception that it is uncured resin). Here the deep dendritic structure is formed on the copper foil before it is coated with the adhesive. It also requires a copper layer that is 0.0007 inches thick. This product can't accommodate traces and trace spacing less than 25μ (0.00098 inch) wide because of the physical characteristics of the dendritic structures as well as the etch factor effect on the copper in the related etching process steps.

The present invention affixes the copper via vapor deposition after the wetting angle has been decreased on a non-fiberglass reinforced polymer substrate surface by irradiating the ion particles on the surface and blowing a reactive gas thereon under vacuum conditions. This method for increasing the adhesion of the copper onto a polymer substrate is well known in the art and discussed in U.S. Pat. No. 5,783,641 "Processes for Modifying Surfaces of Polymers, and Polymer Having Surfaces Modified by Such." This increases the adhesive strength of the polymer surface such that vapor deposition of copper need only yield a diminished thickness of 0.02 mil (0.00002 inch or 0.5μ) to reach a peel strength sufficient to ensure the adherence of the copper to the substrate base. This product, when utilized with the fabrication methods discussed herein, can accommodate line width (traces) and spacing less than 10 microns wide. With these closer tolerances between traces, the fabrications thereof will have tighter spacings and the likely hood of Cathodic Anodic Filament growth between adjacent penetrations through the substrate, along fiberglass reinforcement strands, that cause short circuits on the PCB would be enhanced. Thus the need for the use of non-fiberglass reinforced polymer substrate boards is necessary with the present invention.

Henceforth, an order of magnitude reduction of the size of the planar laminate substrate used to fabricate organic laminate substrate PCBs and semiconductor components coupled with a complex series of laser drilling, copper buildup, resist coating, etching, resist strip, and lamination steps, that yield a 2:1 or better reduction in physical size, would fulfill a long felt need in the electronics industry. The introduction of an adhesive layer affixed to the substrate further allows for greater flexibility in multiple configuration design and fabrication. This new invention utilizes and combines known and new technologies in a unique and novel configuration to overcome the aforementioned problems and accomplish this.

SUMMARY OF THE INVENTION

The general purpose of the present invention, which will be described subsequently in greater detail, is to provide a planar laminate substrate base and method of fabricating organic laminate substrate PCBs, semiconductors, semiconductor wafers and semiconductor devices therefrom, that offer at least 2:1 (50%) reduction in their physical dimensions.

It has many of the advantages mentioned heretofore and many novel features that result in a new planar laminate substrate base and a method of manufacturing miniaturized organic laminate substrate PCBs, semiconductors, semiconductor wafers and semiconductor devices therefrom, which is not anticipated, rendered obvious, suggested, or even implied by any of the prior art, either alone or in any combination thereof.

In accordance with the invention, an object of the present invention is to provide an method for manufacturing an improved PCB capable of having miniaturized electrical pathways possessing line widths and line spacings at or below 10 microns each.

It is another object of this invention to provide an improved planar laminate substrate with a 0.02 mm or less thick copper layer and an adhesive layer thereon capable of supporting functional electrical pathways made of line width and line spacings at or below 10μ each.

It is a further object of this invention to provide a method for manufacturing semiconductors, semiconductor wafers, PCBs and semiconductor devices capable of having miniaturized electrical pathways possessing line widths and line spacings at or below 10μ each.

The subject matter of the present invention is particularly pointed out and distinctly claimed in the concluding portion of this specification. However, both the organization and method of operation, together with further advantages and objects thereof, may best be understood by reference to the following description taken in connection with accompanying drawings wherein like reference characters refer to like elements. Other objects, features and aspects of the present invention are discussed in greater detail below.

DETAILED DESCRIPTION

Figure 1A:
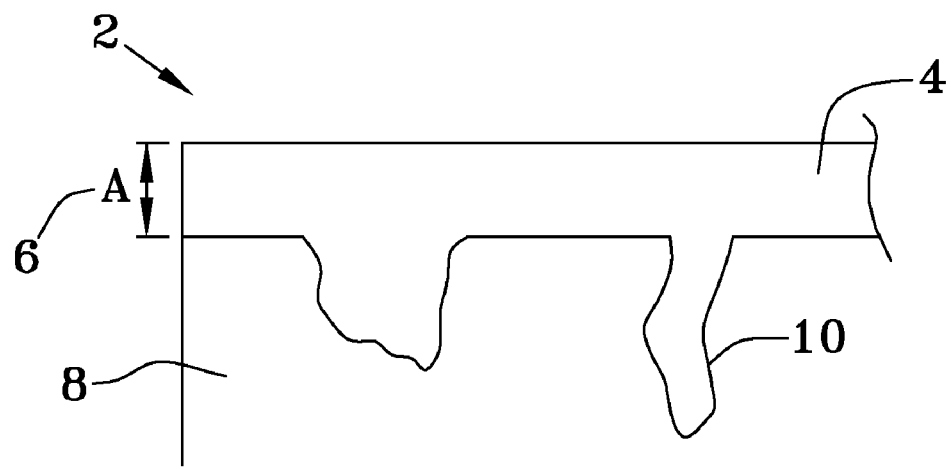
FIG. 1 is a side cross sectional view of the prior art planar laminate substrate.

There has thus been outlined, rather broadly, the more important features of the invention in order that the detailed description thereof that follows may be better understood and in order that the present contribution to the art may be better appreciated. There are, of course, additional features of the invention that will be described hereinafter and which will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein are for the purpose of descriptions and should not be regarded as limiting.

In the following specification, the term PCB is meant to refer to organic laminate substrate printed circuit board/s, semiconductors, semiconductor wafers and semiconductor devices having miniaturized electrical pathways as the substrate and methodology for their fabrication is substantially similar.

In the way of further background, most PCB are made by bonding a base layer of copper on top of an entire planar substrate base (rigid or flexible), or on both sides, building up traces, then removing unwanted copper by etching after applying a temporary mask so as to leave a substrate with only the desired copper traces and trace spacings on the substrate base. This is a subtractive process. This may also be done in a mechanical milling process where the unwanted copper is mechanically milled off of the substrate base.

Another, less common way of making PCB is via an "additive" process. Here, a reverse mask is added that exposes those parts of the substrate base that will eventually have the traces thereon, and then copper traces are added to the bare substrate base (or a substrate base with a very thin layer of copper) by a complex series of electroplating steps until a desired copper thickness is achieved. The mask is stripped away and a brief etching step removes any exposed original copper base layer from the substrate base, creating the trace spacing and isolating the individual traces.

Copper traces on opposite sides of the planar laminate base, may or may not have electrical continuity between them. This may be accomplished by series of vias (through, blind or buried) drilling, copper deposition and etching steps.

The present patent advances the miniaturization of electronic components dramatically over existing state of the art electronic components. This is accomplished because the line width (traces) and line spacing (trace spacing) of the electrically conductive pathways on organic laminate substrate PCB, semiconductors, semiconductor wafers and semiconductor devices (electronic components) is reduced to at least 50% or one half of the original dimensions. This represents a drop from 20 micron wide traces and trace spacing down to 10 micron wide traces and trace spacing or less. This is accomplished by utilizing a very thin (0.02 mil thick) copper base plating in conjunction with a multi step trace fabrication process. The benefits of which are that with the reduced thickness of the copper base layer, there is less trace width reduction during the base copper layer removal (etch). This is best understood with reference to FIGS. 3a and 3b as contrasted to FIGS. 4a and 4b.

Looking at FIG. 1a, a side cross sectional view of the prior art planar laminate substrate 2, it can be seen that the prior art copper base layer 4 has a thickness as indicated by first dimensional arrow A and is anchored into the dielectric polymer substrate base 8 by multiple dendritic anchors 10 (dendrites) so as to be able to exhibit sufficient peel strength between copper base layer 4 and substrate base 8. Under the prior art fabrication methods, this thickness A has not been able to be reduced to less than 0.7 mil and still maintain sufficient peel strength. Additionally, the fiberglass resin substrate base 8 must be sufficiently thick to accommodate the dendritic structure on both its planar sides.

Figure 1B:
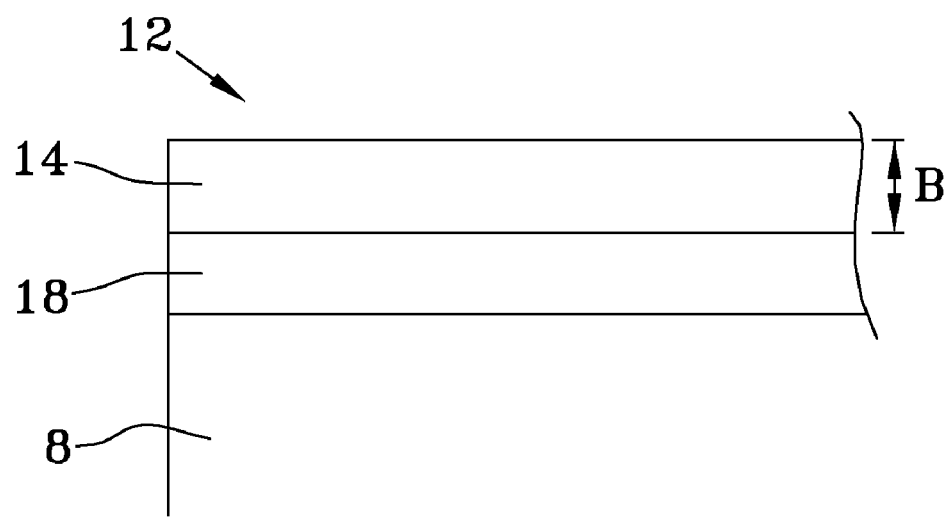

Looking at FIG. 1b, a side cross sectional view of the improved laminate substrate 12, it can be seen that the improved copper trace layer 14 has a thickness as indicated by dimensional arrow B that is anchored onto the dielectric substrate base 8 by an adhesive hydrophillic layer 18 that enables sufficient peel strength between improved copper layer 14 and substrate base 8. This thickness B is 0.02 mil (or less) and is capable of maintaining a sufficient peel strength factor. This enables the thickness of the non-fiberglass reinforced resin substrate base 8 to be reduced by at least the depth of the dendrites 10, or in the case of a double sided PCB, twice the depth of the dendrites 10.

Figure 2:
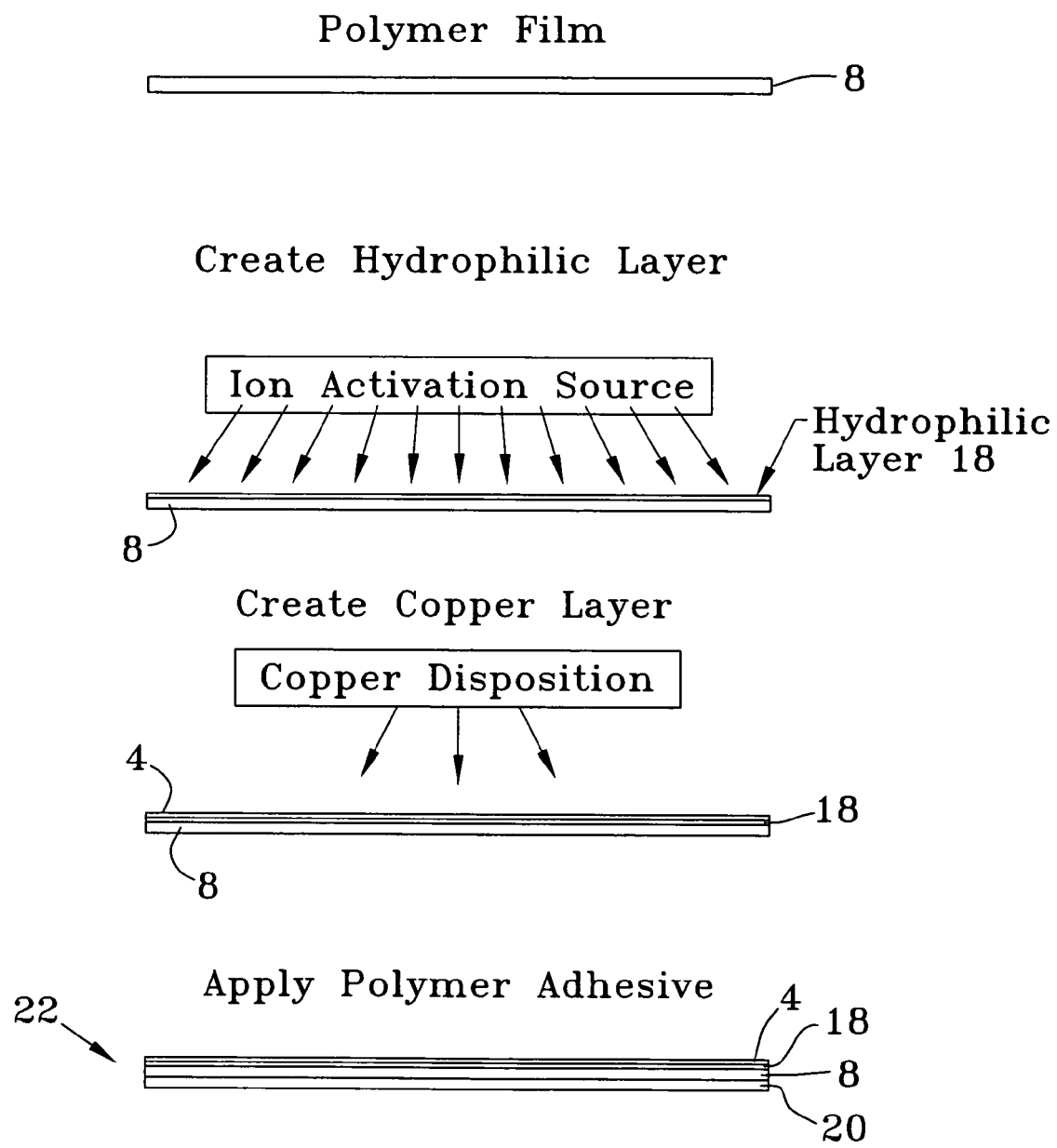
FIG. 2 illustrates the basic steps in the formation of the improved laminar adhesive substrate.

Looking at FIG. 2, the basic steps in the formation of the improved planar laminate substrate 22 can be seen. A hydrophillic layer 18 is formed onto a rigid or flexible polymer substrate base (or film) 8 by irradiating ion particles with energy thereon, while blowing reactive gas or gases directly on the substrate base 8 under vacuum conditions, to decrease the wetting angle and to increase adhesive strength between the base 8, and the copper base layer 4.

A decrease in the wetting angle means that a water drop placed onto the hydrophillic layer 18 is spread widely and thinly whereby the attraction property of the surface to water, that is to say hydrophilicity, increases.

Surface modification of polymers has been utilized commercially since the late 1980's however, the perfection of this application to PCB's is much more recent. Generally speaking, an ion beam is obtained by introducing particles including atoms, molecules and gases (such as argon, oxygen, krypton, air etc.) into any of several types of ion guns (Cold Hollowed Cathode, Kaufman type, high frequency type, etc.) Most of the ion particles that are irradiated onto the polymer surface, cleave the chemical bonds. The reactive gas is blown directly on the polymer surface under vacuum simultaneously with the process of irradiating particles with energy on the polymer surface so as to cause hydrophilic groups to adhere to the substrate base 8. Onto this hydrophillic layer 18, a thin copper base layer 4 is affixed by vapor deposition, or other means, and an adhesive layer 20 may optionally be affixed by spraying dipping or any of the other methods well known in the industry, to the opposite planar side of the substrate base 8 to enable substrate layering. This adhesive layer 20 is a thin layer of the same resin that the polymer substrate base 8 is made of (such as a polyamide) with the exception that the adhesive layer 20 is not fully cured, such that there has not been complete polymer cross linking. Generally, the adhesive layer 20 is not sticky to the touch but rather must be affixed to another surface (like another PCB) by heated pressure lamination. From this point forward, copper traces may be added atop of the copper base layer 4 and the traces and trace spacings can be established.

Figure 3A:
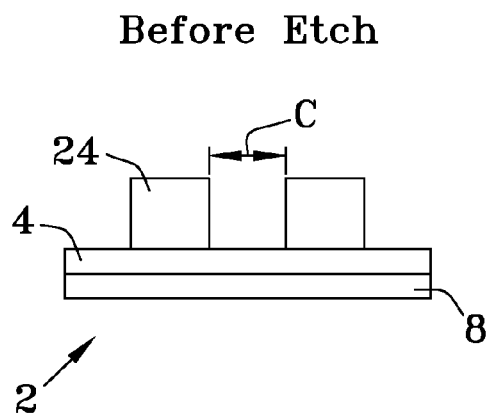
FIGS. 3a and 3b are side cross sections of prior art PCBs showing adjacent traces during the etch stages of the fabrication process.
Figure 4A:
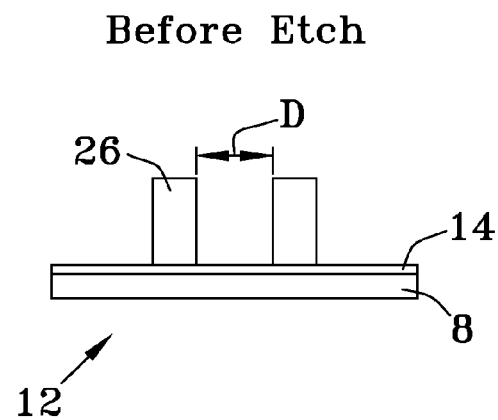
FIGS. 4a and 4b are side cross sections of PCBs showing adjacent traces during the etch stages of the present invention's fabrication process.
Figure 3B:
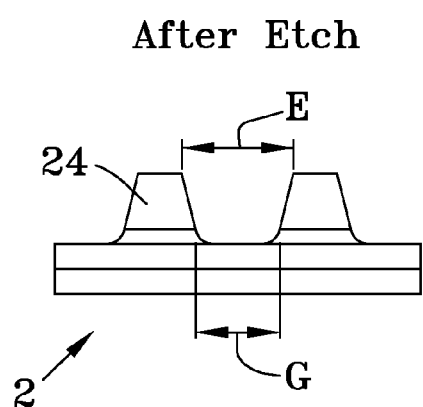
Figure 4B:
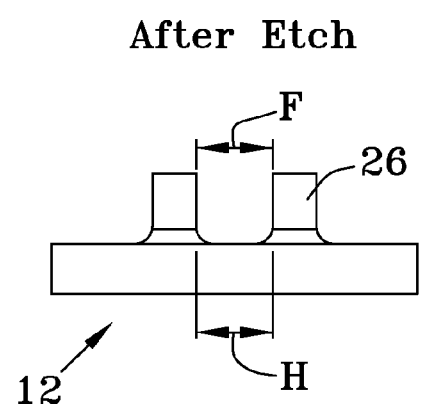

FIGS. 3a and 3b are side cross sections of prior art PCB 2 showing adjacent Prior art traces 24 during the etch stages of the fabrication process. FIGS. 4a and 4b are side cross sections of improved PCB 12 showing adjacent improved traces 26 during the etch stages of the present invention's fabrication process. At this stage, both the copper base layer 4 and the improved copper base layer 14 have buildup copper layers formed thereon (traces) that will eventually become finished traces after multiple buildup, masking, etching and drilling steps. For purposes of explanation, the distance between the tops of adjacent traces 24 and adjacent improved traces 26 before the etching (designated by dimensional arrows C and D) is equal. However, after the chemical etching, the distance between the tops of adjacent traces 24 and adjacent improved traces 26 (designated by dimensional arrows E and F) differ substantially.

There is little if any, change in the distance between the tops of adjacent traces 24 and adjacent improved traces 26 before the etching process and the distance between adjacent trace/base interfaces and adjacent improved trace/base interfaces after the etching process (designated by dimensional arrows G and H). That is because the etching process is stopped in both fabrications once a suitable width of substrate base is revealed.

It is the distance between the tops of adjacent traces that form the trace spacing (the effective or operational distance.) Thus, while the adjacent trace/base interface distance of either type of trace G or H remains substantially similar, when the PCB fabrication is finished, the trace spacing E on the prior art PCB is much larger than the trace spacing on the improved PCB F. This is caused by the additional etching time the prior art PCB fabrication process requires to etch through it's thicker copper base layer 4 with respect to that of the improved copper base layer 14 on the improved laminate substrate base 12. During this period, the vertical sides of traces 24 are gradually removed, since the etchant cannot discriminate between the trace copper and the base layer copper, resulting in the trace's overall trapezoidal configuration.

Additionally, because of the etching effects mentioned, the width of the traces 24 must be much larger than the width of the improved traces 26 to compensate for the narrowing of the trace tops on the prior art PCB. Thus, the only limiting factor for determining the trace thickness and trace spacing on an improved PCB 12 is the existing technology for affixing a trace to a base substrate 8 while the limiting factor for determining the trace thickness and trace spacing on a prior art PCB 2 also depends upon the amount of copper lost off of the trace in the etching process. The prior art trace width prior to etching must be approximately twice as thick as that of its counterpart on the improved laminate substrate.

Experimentation has shown that while the distance C between the non etched traces on the prior art substrate 2 and the non etched traces D on the improved substrates 12 may be identical, after fabrication the distance E between the etched trace tops on the prior art substrate 2 is at least twice that of the distance between the etched trace tops F on the improved substrate 12. The improved method of fabrication yields traces that are at maximum, 10 microns wide and trace spacings that are at maximum 10 microns wide. This is a physical dimensional reduction of one half over the prior art.

The method for fabricating organic laminate substrate PCBs having 10 micron wide or lesser traces and spaces there between comprises the following steps as illustrated by FIGS. 5-20. The method for fabricating semiconductors, semiconductor wafers and semiconductor devices having 10 micron wide or lesser traces and spaces there between comprises the following steps as illustrated by FIGS. 13-20. The additional steps of FIGS. 5-12 are not required where existing circuitry is present upon which the improved laminate material can be applied.

Figure 5:
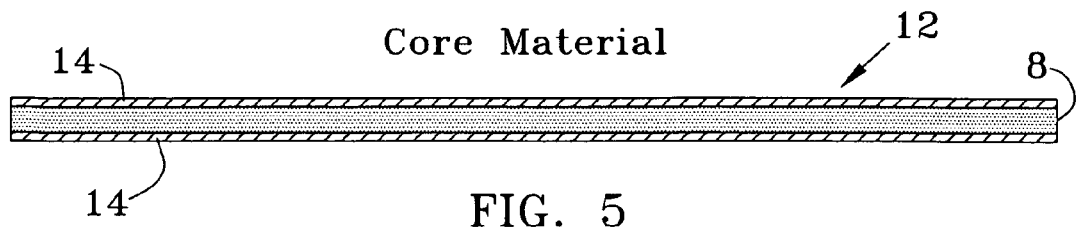
FIGS. 5-20 are cross sectional views of the improved laminar adhesive substrate as it undergoes the various steps of fabrication.

The preferred starting point for fabrication of organic laminate substrate PCBs is commercially available substrate 12, shown in FIG. 5 as two layers of copper cladding 14, one each laminated on opposing sides to a fully cured polymer dielectric substrate planar base 8. (The copper cladding may be on one or two sides.) It is well known in the art that the base may be made from of a plethora of different polymer dielectric materials that possess the sufficient material properties.

Figure 6:
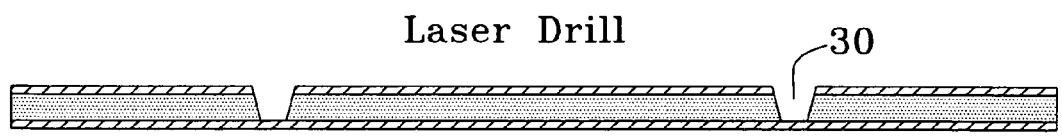

A laser drill cuts a blind perforation 30 through one of the copper claddings 14 and the base 8, down to the base/second copper cladding interface. (FIG. 6)

Figure 7:
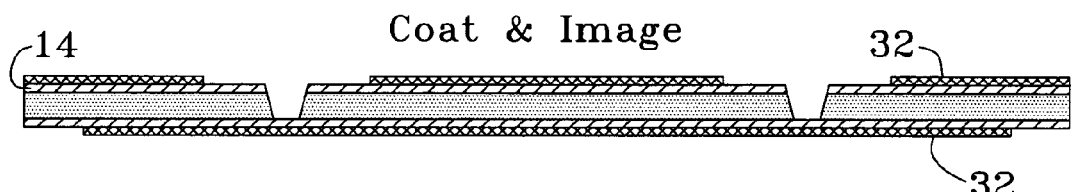

A patterned image 32 of the area not to have any copper traces deposited thereon is applied as a plating resist to the planar surface of the copper base 14. A mask (image) is applied such that the exposed resist material when exposed to UV light will polymerize such that the non-polymerized resist can be developed away (FIG. 7 illustrates the results of these steps).

Figure 8:
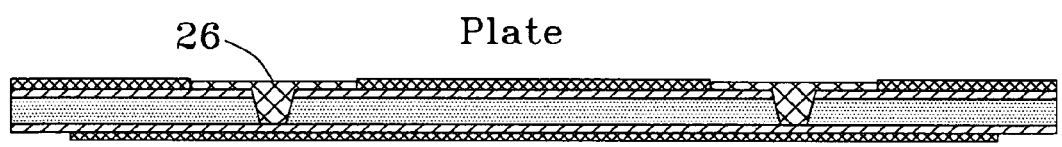

An electric current is applied to the non drilled copper cladding 14 such that the blind perforations 30 and the non resist coated areas of the copper cladding 14 are plated with copper. In this step it is to be noted that the copper plating 26 will first accumulate at the bottom of the blind perforations 30 and then onto the non resist coated areas of the drilled copper cladding 14 (FIG. 8).

Figure 9:
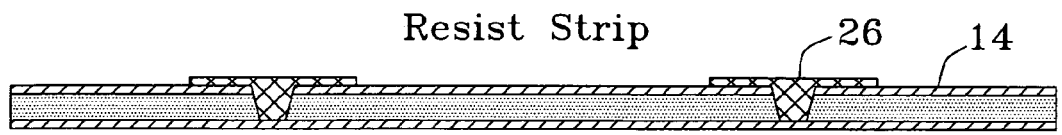

The plating resist 32 is stripped from both of the copper claddings 14, (FIG. 9 illustrates the results of this step).

Figure 10:

An etch resist 34 is applied to the non drilled copper cladding 14 (FIG. 10).

Figure 11:
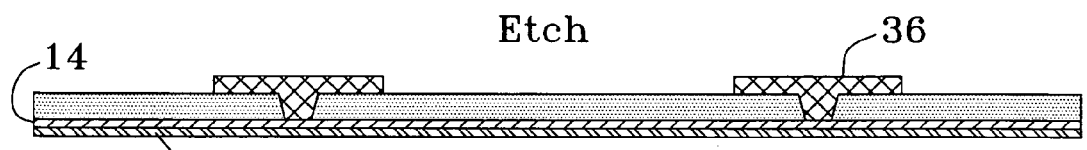

All of the exposed base copper cladding 14 is etched away leaving only the copper plating/underlying copper cladding pads 36 (FIG. 11).

Figure 12:
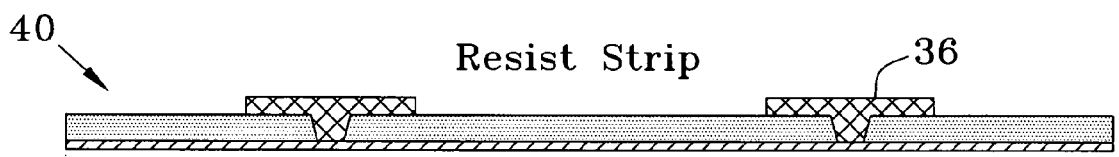

The etch resist 34 is stripped from the undrilled copper cladding 14 (FIG. 12).

These steps as depicted in FIGS. 5-12 illustrate the preferred method of fabrication for the base planar material 40 for fabrication into organic laminate substrate PCBs. FIGS. 13-20 depict the method for fabricating organic laminate substrate PCBs starting with this base planar material 40, or for fabricating semiconductors, semiconductor wafers and semiconductor devices on their appropriate base materials (such as silicon wafers). This is accomplished by applying the improved planar laminate substrate 22 thereon the base planar material 40 or appropriate base material.

Figure 13:
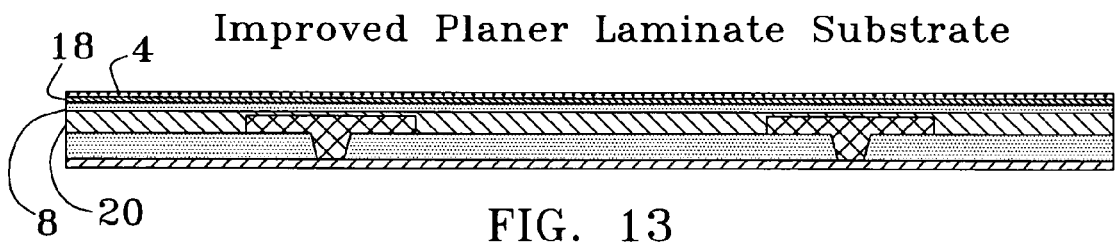

In FIG. 13, it can be seen that the adhesive layer 20 of the improved planar laminate substrate 22 has been directly affixed by heat and pressure to the top side of the appropriate base material (although it may also be affixed to both the top and bottom sides). Since the adhesive layer 20 is a partially cured polymer, when heated and pressed onto the base material it flows to conform to, and adheres to the irregularities of the surface of the base material it is applied to.

Figure 14:
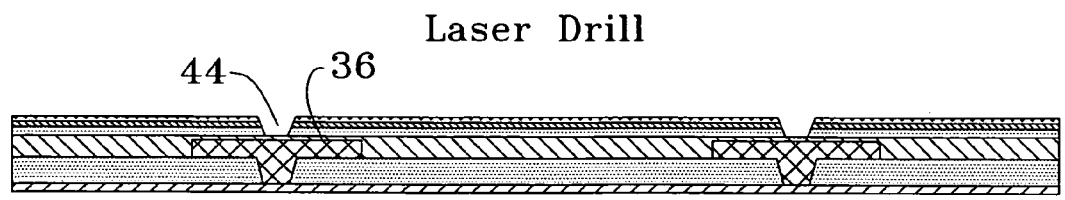

A blind bore 44 is formed through the improved planar laminate substrate 22 penetrating to the copper cladding pads 36 on the underlying base material (FIG. 14).

Figure 15:

A patterned image 32 of the area not to have any copper traces deposited thereon is applied as a plating resist to the copper base layer 4. A mask (image) is applied such that the exposed resist material when exposed to UV light will polymerize such that the non-polymerized resist can be developed away (FIG. 15).

Figure 16:
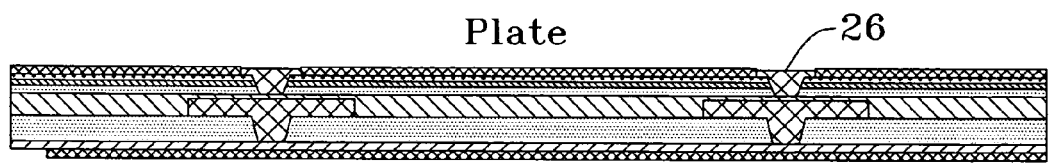

An electric current is applied to the non drilled copper cladding 14 such that the blind bores 44 and the non resist coated areas of the copper base layer 4 are plated with copper. Again, here the copper plating 26 will first accumulate at the bottom of the blind bores 44 (FIG. 16). This copper forms micro circuitry, (pads and traces) 50 having widths down to 10μ or less.

Figure 17:

The plating resist 32 is stripped from both of the copper cladding 14 and the base copper 4 (FIG. 17 illustrates the results of this step).

Figure 18:
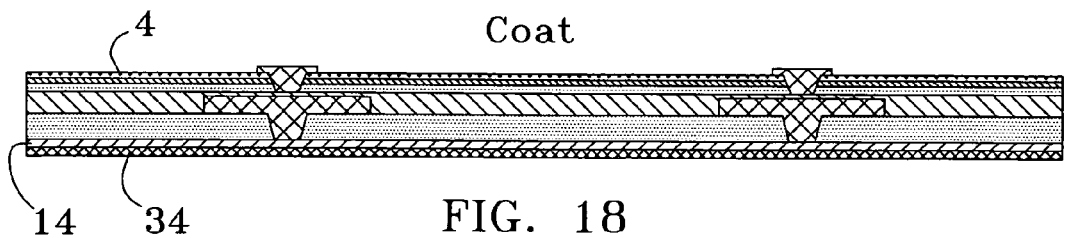

An etch resist 34 is applied to the non drilled copper cladding 14 (FIG. 18).

Figure 19:
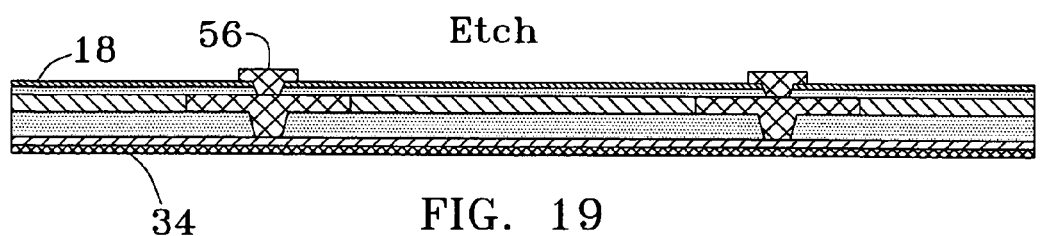

All of the exposed base copper 4 is etched away leaving only the micro circuitry 50 and the remnants of the hydrophillic layer 18 (FIG. 19).

Figure 20:

The etch resist 34 is stripped from the undrilled copper cladding 14 (FIG. 20).

It is to be note that is process may be repeated numerous times upon this build-up product to create the necessary number of circuit layers for a specific electronic component's design.

The above invention, besides offering a 2:1 or greater reduction in physical dimensions, should minimize, or eliminate, the likely hood of Cathodic Anodic Filament growth between adjacent penetrations through the substrate, render stable electrical properties throughout a broad operating frequency range, have a dielectric constant (Dk, Er) of approximately 3.5, a loss tangent (Df) of approximately 0.003 and a Tg of approximately 220° C. The trace line and space widths will be a maximum of 10μ or less, the via pads will not exceed 75μ, the via drill will not exceed 50μ and the dielectric thickness will be 50μ or less.

The above description will enable any person skilled in the art to make and use this invention. It also sets forth the best modes for carrying out this invention. There are numerous variations and modifications thereof that will also remain readily apparent to others skilled in the art, now that the general principles of the present invention have been disclosed. Such deviations may be in the material selection for conductors, resins, polymers etc. As such, those skilled in the art will appreciate that the conception, upon which this disclosure is based, may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

Having thus described the invention, what is claimed as new and desired to be secured by Letters Patent is as follows:

1. A method for the manufacture of organic laminate substrate Printed Circuit Boards (PCB) having electrical pathways at or below 10μ wide comprising the steps of:
   1) obtaining a fully cured polymer dielectric substrate planar base having a first face with a first layer of copper cladding laminated thereon and a second parallel face with a second layer of copper cladding thereon;
   2) forming at least one blind perforation through said first layer of copper cladding and said planar base down to said second layer of copper cladding;
   3) applying a plating resist material to the areas of the first and second layers of copper cladding that are not to have any copper traces deposited thereon;
   4) applying a mask (image) such that the exposed plating resist material when exposed to UV light will polymerize so the non-polymerized plating resist material can be developed away;
   5) applying an electric current to said second layer of copper cladding such that the blind perforations and the non plating resist material coated areas of the first and second layers of copper cladding are plated with copper;
   6) stripping the plating resist material from the first and second layers of copper cladding;
   7) applying an etch resist material to the second layer of copper cladding;
   8) etching away all of the exposed first layer of copper cladding to leave copper cladding pads extending from said planar base;
   9) stripping the etch resist from the second layer of copper cladding to form a base planar material for the fabrication organic laminate substrate PCBs;
   10) obtaining an improved planar laminate substrate made of a non-fiberglass reinforced dielectric polymer resin substrate film base having a top and bottom planar face with a hydrophillic layer formed onto said top planar face, a copper base layer formed on the hydrophillic layer and an adhesive layer affixed onto the bottom planar face wherein said adhesive layer is made of said dielectric polymer in a non fully cured state;
   11) affixing the adhesive layer of the improved planar laminate substrate by heat and pressure to at least a first side of the base planar material for the fabrication organic laminate substrate PCBs such that the adhesive layer conforms and adheres to irregularities of the first side;
   12) forming at least one blind bore through the improved planar laminate substrate penetrating to the copper cladding pads of the base planar material;
   13) applying plating resist material onto the copper base layer of the improved planar laminate substrate in a patterned image of the area not to have any copper traces deposited thereon;
   14) applying a mask (image) to the plating resist material such that the exposed plating resist material when exposed to UV light will polymerize such that the non-polymerized plating resist material can be developed away;
   15) applying an electric current to the second layer of copper cladding on the planar base material such that the blind bores and the non plating resist material coated areas of the copper base layer are plated with copper so as to form micro circuitry, (pads and traces) having widths down to 10μ or less;

16) stripping the plating resist material from both the second layer of copper cladding and the copper base layer;

17) applying an etch resist material to the copper base layer;

18) etching away all of the exposed copper from the copper base layer leaving only micro circuitry and the remnants of the hydrophillic layer;

19) stripping the etch resist material from the second layer of copper cladding.

2. The planar laminate substrate of claim 1 wherein said planar base has a thickness of 0.00098 inch (25μ) or less, and said copper base layer has a thickness of 0.00002 inch (5μ) or less.

3. The planar laminate substrate of claim 2 wherein said substrate has a thickness of 0.00196 inch (50μ) or less.

4. The method for the manufacture of organic laminate substrate Printed Circuit Boards (PCB) of claim 1 further comprising a final step of repeating steps 10 to 19, affixing said adhesive layer to said copper base layer of the improved planar laminate substrate affixed to said improved planar laminate substrate in step 11 so as to create the necessary number of circuit layers for a specific electronic component's design.

5. A method for the manufacture of organic laminate substrate Printed Circuit Boards (PCB), semiconductors, semiconductor wafers and semiconductor devices having electrical pathways at or below 10μ wide comprising the steps of:

1) obtaining an improved planar laminate substrate made of a non-fiberglass reinforced dielectric polymer resin substrate film base having a top and bottom planar face with a hydrophillic layer formed onto said top planar face, a copper base layer formed on the hydrophillic layer and an adhesive layer affixed onto the bottom planar face wherein said adhesive layer is made of said dielectric polymer in a non fully cured state;

2) affixing the adhesive layer of the improved planar laminate substrate by heat and pressure to at least a first side of a planar base material of a fully cured polymer dielectric substrate planar base having a first face with copper cladding pads laminated thereon that extend through said substrate planar base to a second layer of copper cladding thereon a second parallel face of said substrate planar base for the fabrication of semiconductors, semiconductor wafers and semiconductor devices such that the adhesive layer conforms and adheres to irregularities of the first side;

3) forming at least one blind bore through the improved planar laminate substrate penetrating to the copper cladding pads of the planar base material;

4) applying plating resist material onto the copper base layer of the improved planar laminate substrate in a patterned image of the area not to have any copper traces deposited thereon;

5) apply a mask (image) to the plating resist material such that the plating resist material not covered by said mask when exposed to UV light will polymerize such that the non-polymerized plating resist material can be developed away;

6) apply an electric current to the second layer of copper cladding on the planar base material such that the blind bores and the non plating resist material coated areas of the copper base layer are plated with copper so as to form micro circuitry, (pads and traces) having widths down to 10μ or less;

7) stripping the plating resist material from both the second layer of copper cladding and the copper base layer;

8) applying an etch resist material to the copper base layer;

9) etching away all of the exposed copper from the copper base layer leaving only micro circuitry and the remnants of the hydrophillic layer; and 10) stripping the etch resist material from the second layer of copper cladding.

6. The method for the manufacture of organic laminate substrate Printed Circuit Boards (PCB), semiconductors, semiconductor wafers and semiconductor devices of claim 5 wherein the planar base material is a silicon wafer.

7. The method for the manufacture of organic laminate substrate Printed Circuit Boards (PCB), semiconductors, semiconductor wafers and semiconductor devices of claim 5 wherein the planar base material is a fully cured polymer dielectric substrate planar base having a first face with a first layer of copper cladding laminated thereon and a second parallel face with a second layer of copper cladding thereon, that undergoes the following steps;

1) forming at least one blind perforation through said first layer of copper cladding and said planar base down to said second layer of copper cladding;

2) applying a plating resist material to the areas of the first and second layers of copper cladding that are not to have any copper traces deposited thereon;

3) applying a mask (image) such that the exposed plating resist material when exposed to UV light will polymerize so the non-polymerized plating resist material can be developed away;

4) applying an electric current to said second layer of copper cladding such that the blind perforations and the non plating resist material coated areas of the first and second layers of copper cladding are plated with copper;

5) stripping the plating resist material from the first and second layers of copper cladding;

6) applying an etch resist material to the second layer of copper cladding;

7) etching away all of the exposed first layer of copper cladding to leave copper cladding pads extending from said substrate base material;

8) stripping the etch resist from the second layer of copper cladding to form a base planar material for the fabrication organic laminate substrate PCBs.

8. The method for the manufacture of organic laminate substrate Printed Circuit Boards of claim 5 wherein said blind perforations are formed by a laser drill.

* * * * *